(12) United States Patent
Wu et al.

(10) Patent No.: US 10,879,114 B1
(45) Date of Patent: Dec. 29, 2020

(54) CONDUCTIVE FILL

(71) Applicant: Taiwan Semiconductor Manufacturing Company, Ltd., Hsinchu (TW)

(72) Inventors: Jung-Tang Wu, Kaohsiung (TW); Chi-Hung Liao, Hsinchu (TW); Szu-Hua Wu, Zhubei (TW); Liang-Yueh Ou Yang, New Taipei (TW); Chin-Szu Lee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/549,256

(22) Filed: Aug. 23, 2019

(51) Int. Cl.
| | |
|---|---|
| *H01L 21/4763* | (2006.01) |
| *H01L 21/768* | (2006.01) |
| *H01L 29/40* | (2006.01) |
| *H01L 23/532* | (2006.01) |
| *H01L 29/45* | (2006.01) |

(52) U.S. Cl.
CPC .. *H01L 21/76856* (2013.01); *H01L 21/76873* (2013.01); *H01L 23/53209* (2013.01); *H01L 29/401* (2013.01); *H01L 29/45* (2013.01)

(58) Field of Classification Search
CPC ............... H01L 21/4857; H01L 21/486; H01L 2224/02331; H01L 2224/83191; H01L 23/49822; H01L 23/5226; H01L 21/76837
USPC ........ 438/622, 627, 637, 643; 257/750, 751, 257/758
See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2004/0235313 A1* | 11/2004 | Frank ................. | H01L 21/02189 438/785 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0292806 A1* | 11/2013 | Ma ...................... | H01L 21/76846 257/632 |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0179706 A1* | 6/2015 | Rocklein ............. | H01L 45/1233 257/4 |

(Continued)

*Primary Examiner* — S. V. Clark
(74) *Attorney, Agent, or Firm* — Slater Matsil, LLP

(57) ABSTRACT

A conductive fill is provided in an opening of an interconnect layer. A seed layer is formed, a portion of which is then oxidized. The oxygen is removed in a treatment process and the surface of the de-oxidized seed layer is hydrolyzed to form a hydroxyl sublayer and moisturized. The conductive fill is formed over the hydroxyl sublayer.

20 Claims, 13 Drawing Sheets

(56) References Cited

U.S. PATENT DOCUMENTS

2020/0168503 A1\* 5/2020 Roy .................. H01L 21/02271

\* cited by examiner

CONDUCTIVE FILL

BACKGROUND

The semiconductor industry has experienced rapid growth due to continuous increase in functionality and speed of integrated circuits for any given cost. This has been enabled primarily by continuous improvements in the integration density of functional circuit blocks, e.g., memory arrays, digital logic gates, differential amplifiers and the like. This increase in density has been achieved by two means: (1) increased planar density due to repeated reductions in minimum feature size and, (2) increased vertical integration achieved by stacking an increasing number of interconnect levels and components. The former allows for a denser placement of electronic components (e.g., transistors) and metal conductors at any given level, whereas the latter allows for placement of components and routing signals and power lines using multiple levels located vertically above each other.

A majority of electronic components are formed in a semiconductor substrate. These, as well as other electronic components, are connected to each other and to external signals and power supplies according to a circuit design to construct an integrated circuit (IC). These connections are achieved by conductive interconnect structures, such as lines and vias that collectively constitute a multilevel interconnect system with its elements formed at multiple discrete levels above the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
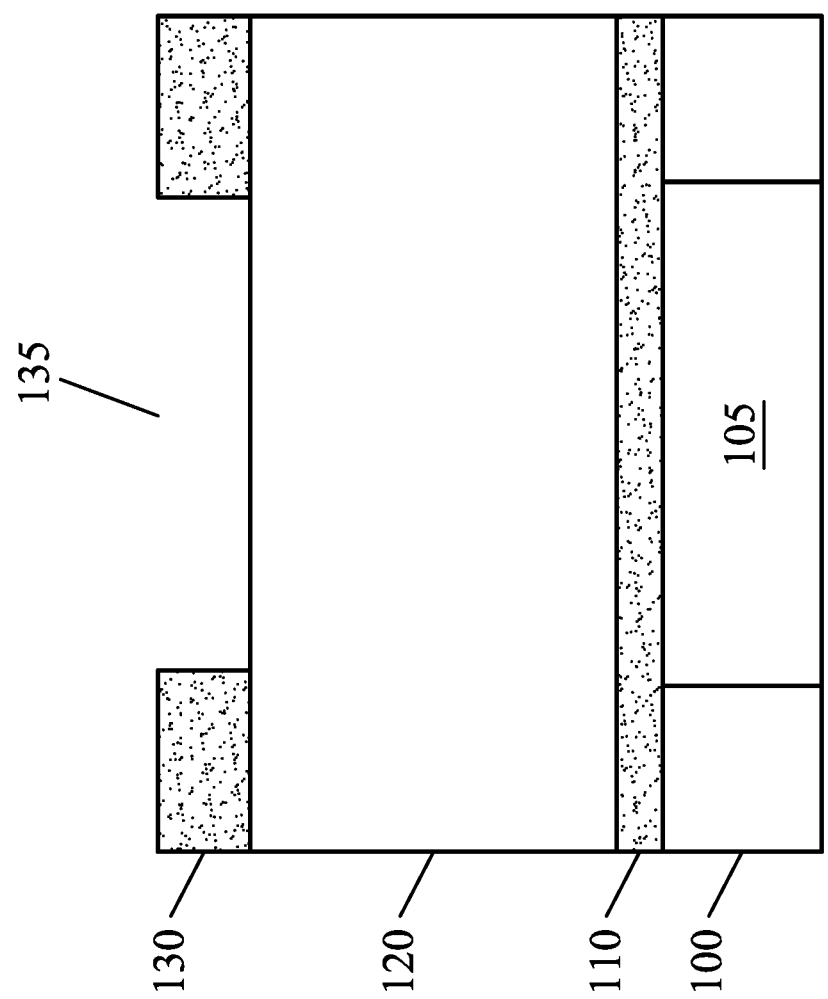
FIGS. 1-12 illustrate intermediate steps in the formation of a conductive fill, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following disclosure provides many different embodiments, or examples, for implementing different features of the disclosure. Specific examples of materials, structures, and fabrication processes are described below to illustrate the inventive concepts. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

This disclosure describes elements of an interconnect system. The interconnect system may be used in a multi-level interconnect comprising conductive interconnect structures of conductive lines, contacts, and vias used to connect an electronic device in an integrated circuit. Such an interconnect system may be used, for example, in the context of forming a fin field effect transistor (FinFET), a planar metal-oxide-semiconductor FET (MOSFET), a MOS capacitor, a diffusion resistor, a body contact, a redistribution structure, or the like. In other words, the methods described herein may be used in any device where a conductive fill is used to provide a conductor to another feature. Such features may include signal, power, or ground inputs or outputs of a device, optionally by way of contact pads, vias, metal lines, and so forth.

Embodiments described herein provide conductors with improved operating characteristics, especially at ultra-small cross-sectional areas. For example, some embodiments utilize cobalt as the principal conductive material. Further, the embodiments of this disclosure include process steps used in the surface preparation and subsequent electrochemical plating method to deposit cobalt to reduce or eliminate the presence of a thin cobalt oxide layer that can impede the conduction of current in the conductors. An oxide layer, such as cobalt oxide, can impede fill performance during deposition of the conductive fill and may leave gaps, oxide pockets, and/or areas of adhesion failure (i.e., delamination). Thus, the embodiments of this disclosure can enable a reduction in the time required to electrically access electronic devices (e.g., transistors), enable a reduction in impedance or voltage drop across the conductor, and can thereby improve the performance of an electrical circuit that uses the electronic devices in its electrical design. Accordingly, this disclosure is advantageous for fabrication of and miniaturization of the state-of-the-art integrated circuits.

The conductive fills described herein may also be referred to as connectors or contacts formed in a substrate, where the substrate is an insulating material, such as a dielectric material, or a semi-conductor material.

FIGS. 1-12 illustrate various intermediate steps in the formation of a conductive fill, in accordance with some embodiments. FIG. 1 illustrates a cross-section of a device layer 120 in which a conductive fill will be made in subsequent processes. The device layer 120 will be referred to as an interconnect layer 120. In some embodiments, the interconnect layer 120 may be formed over an etch stop layer (ESL) 110. ESL 110 may be formed over a substrate 100. Patterned mask layer 130 is formed over the interconnect layer 120. Each of these layers are described below.

In some embodiments, the substrate 100 may be formed of a semiconductor material such as silicon, silicon germanium, or the like. In some embodiments, the substrate 100 is a crystalline semiconductor substrate such as a crystalline silicon substrate, a crystalline silicon carbon substrate, a crystalline silicon germanium substrate, a III-V compound semiconductor substrate, or the like. In an embodiment the substrate 100 may comprise bulk silicon, doped or undoped, or an active layer of a silicon-on-insulator (SOI) substrate. Generally, an SOI substrate comprises a layer of a semiconductor material such as silicon, germanium, silicon germanium, or combinations thereof, such as silicon germanium on insulator (SGOI). Other substrates that may be used include multi-layered substrates, gradient substrates, or hybrid orientation substrates.

In some embodiments, the substrate 100 may be a portion of an interconnect or a redistribution structure. The substrate 100 may be formed of an insulating material, such as a dielectric material. In some embodiments, the substrate 100 may include an Inter-Metal Dielectric (IMD) layer or an Inter-Layer Dielectric (ILD) layer, which may include a dielectric material having a low dielectric constant (k value) lower than 3.8, lower than about 3.0, or lower than about 2.5, for example, and conductive features, such as the conductive feature 105. The insulating material of substrate 100 may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), MethylSilsesQuioxane (MSQ), or the like.

The conductive feature 105 may be coupled to an active or passive device (e.g., a transistor or other electrical component) which may be embedded in the substrate 100 or formed in another substrate. The conductive feature 105 may include, for example, a source/drain region of a transistor, a gate electrode, a contact pad, a portion of a via, a portion of a metal line, and so forth. Active devices may comprise a wide variety of active devices such as transistors and the like and passive devices may comprise devices such as capacitors, resistors, inductors and the like that together may be used to generate the desired structural and functional parts of the design. The active devices and passive devices may be formed using any suitable methods either within or else on the substrate 100.

The etch stop layer (ESL) 110 may comprise a dielectric material such as silicon carbide, silicon nitride, or the like. The ESL 110 may be formed of a nitride, a silicon-carbon based material, a carbon-doped oxide, and/or combinations thereof. The ESL 110 may be formed of a metallic material. The formation methods include Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In accordance with some embodiments, the ESL 110 is also used as a diffusion barrier layer for preventing undesirable elements, such as copper, from diffusing into the subsequently formed low-k dielectric layer. The ESL 110 may include Carbon-Doped Oxide (CDO), carbon-incorporated silicon oxide (SiOC) or oxygen-Doped Carbide (ODC). The ESL 110 may also be formed of Nitrogen-Doped silicon Carbide (NDC). The ESL 110 may comprise a different material than substrate 100 and/or conductive feature 105 and/or interconnect layer 120 to provide etch selectivity during subsequent etching processes. In some embodiments, the ESL 110 may comprise one or more distinct layers. The materials of the ESL 110 may be deposited to a total thickness of between about 30 Å and about 100 Å, such as about 50 Å.

The interconnect layer 120 is formed over the ESL 110. In accordance with some embodiments, the interconnect layer 120 may be formed of a low-k dielectric material having a dielectric constant (k-value) lower than about 3.0, about 2.5, or even lower. The interconnect layer 120 may be formed of phosphosilicate glass (PSG), borosilicate glass (BSG), boron-doped phosphosilicate glass (BPSG), fluorine-doped silicate glass (FSG), tetraethyl orthosilicate (TEOS), Black Diamond (a registered trademark of Applied Materials Inc.), a carbon-containing low-k dielectric material, Hydrogen SilsesQuioxane (HSQ), MethylSilsesQuioxane (MSQ), or any suitable material. The interconnect layer 120 may be formed using any suitable process, including a spin-on technique, Plasma Enhanced Chemical Vapor Deposition (PECVD), High-Density Plasma CVD (HDPCVD), Atomic Layer Deposition (ALD), low pressure CVD (LPCVD), physical vapor deposition (PVD), and the like.

A mask layer 130 is formed over the interconnect layer 120. The mask layer 130 is also patterned to form an opening 135 therein. It should be understood that the opening 135 is illustrated as an example, multiple other openings may be made. Openings such as opening 135 may extend along the plane of the interconnect layer 120 and may extend partially through the interconnect layer 120 (having a bottom surface disposed between the upper surface and lower surface of the interconnect layer 120) and/or may extend fully through the interconnect layer 120 (as illustrated with opening 135). Although opening 135 is depicted as having vertical sidewalls, in some embodiments, opening 135 may have angled sidewalls such that the opening 135 is wider at its top than its bottom.

The mask layer 130 may be any suitable mask layer, including a photo-patternable material, a hard mask layer, a metal mask, and so forth. In some embodiments, the mask layer 130 may result from a patterning process which utilizes a single layer mask, double layer mask, triple layer mask, multiple patterning process (e.g., double patterning, triple patterning, etc.), and so forth. For example, where the mask layer 130 is a photo resist, the mask layer 130 may be patterned using an acceptable photolithography technique.

In another example, where the mask layer 130 is part of a triple layer (or tri-layer) mask, the mask layer 130 may be the bottom layer of the triple layer mask. Not shown, a middle layer and upper layer may be formed over the bottom layer. The bottom layer and upper layer may be formed of photo resists, which comprise organic materials. The middle layer may comprise an inorganic material, which may be a carbide (such as silicon oxycarbide), a nitride (such as silicon nitride), an oxynitride (such as silicon oxynitride), an oxide (such as silicon oxide), or the like. The middle layer has a high etching selectivity with relative to the upper layer and the bottom layer, and hence the upper layer is used as an etching mask for the patterning of middle layer, and middle layer is used as an etching mask for the patterning of the bottom layer. After the upper layer is formed, the upper layer is patterned using an acceptable photolithography technique. The patterned upper layer includes openings therein which correspond to the opening 135. Next, the middle layer is then etched to pattern the middle layer using the patterned upper layer as an etching mask, so that the pattern of the patterned upper layer is transferred to the middle layer to create a patterned middle layer. Etching the middle layer extends openings corresponding to the opening 135 to the middle layer. Any suitable etching technique may be used, such as a wet or dry etch using an etchant which is selective to the middle layer material. The bottom layer (corresponding in such embodiments to the mask layer 130) is then etched to form the mask layer 130. The bottom layer is etched using the middle layer as an etching mask, so that the pattern of the middle layer is transferred to the bottom layer, extending the opening in the middle layer corresponding to the opening 135 into the bottom layer.

In another example, where the mask layer 130 is formed from a multiple patterning technique, the opening 135 may be formed using either a self-aligned multiple patterning technique or a multiple patterning multiple etching technique. When a self-aligned multiple patterning technique is used, a mandrel layer is patterned to form mandrels. A spacer layer is then formed over the mandrel layer and etched to form vertical spacers adjacent the mandrels. The mandrels are then removed and the spacers remaining may be used to pattern an underlying layer, such as the mask layer 130. In some embodiments, the self-aligned multiple patterning technique may be repeated with another mandrel layer. When a multiple patterning multiple etching technique is used, the mask layer 130 may be patterned to form the opening 135 in one of the patterning stages. Other openings may be formed in other patterning stages.

Figure 2:
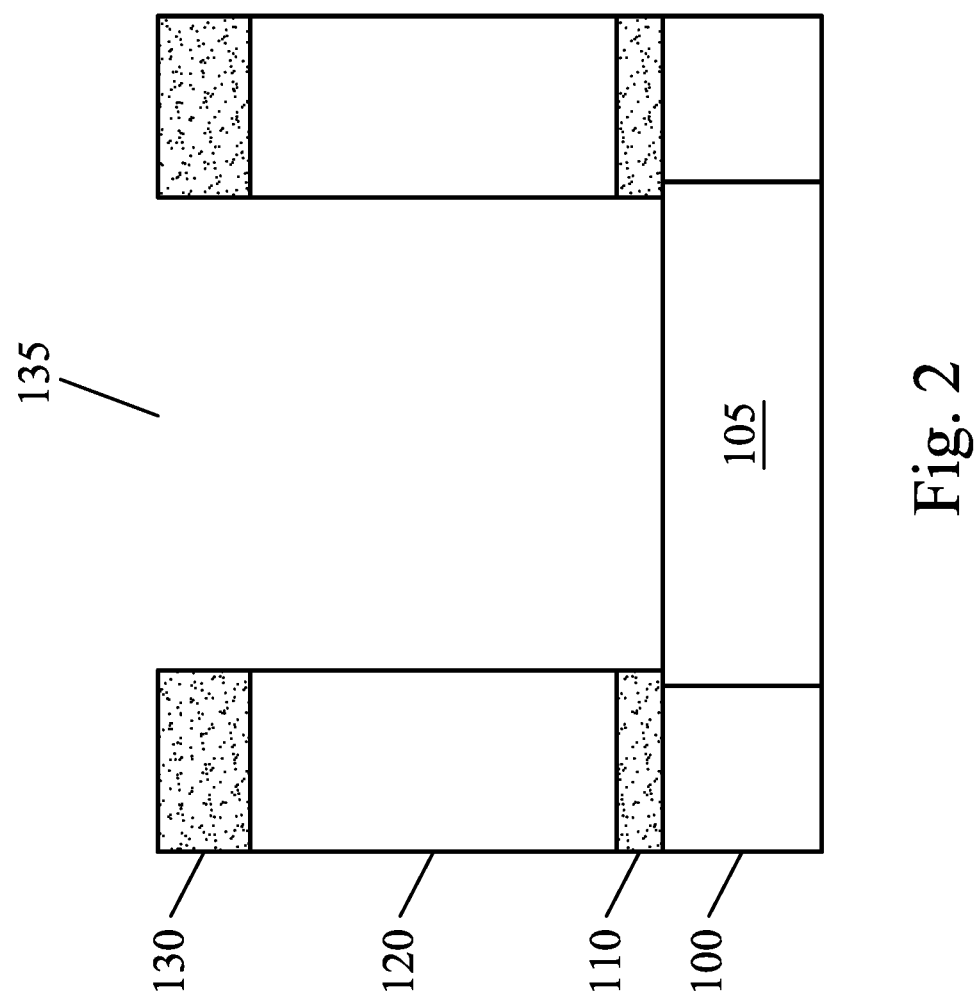

In FIG. 2, the opening 135 is extended through the interconnect layer 120 by transferring the pattern of the mask layer 130 to the interconnect layer 120. In embodiments utilizing the ESL 110, the opening 135 is further extended through the ESL 110. The conductive feature 105 may be exposed in the process so that a subsequently deposited conductive fill is electrically coupled to the conductive feature 105. The opening 135 may correspond to a via and/or metal line which will be formed therein in a conductive fill process. The interconnect layer 120 may be patterned by a suitable etching technique, including for example a wet or dry etch using a suitable etchant selective to the material of the interconnect layer 120. The ESL 110 may control the etching of the interconnect layer 120. After etching the interconnect layer 120, the ESL 110 may be etched using another suitable etching technique, including for example a wet or dry etching using a different suitable etchant.

Figure 3:
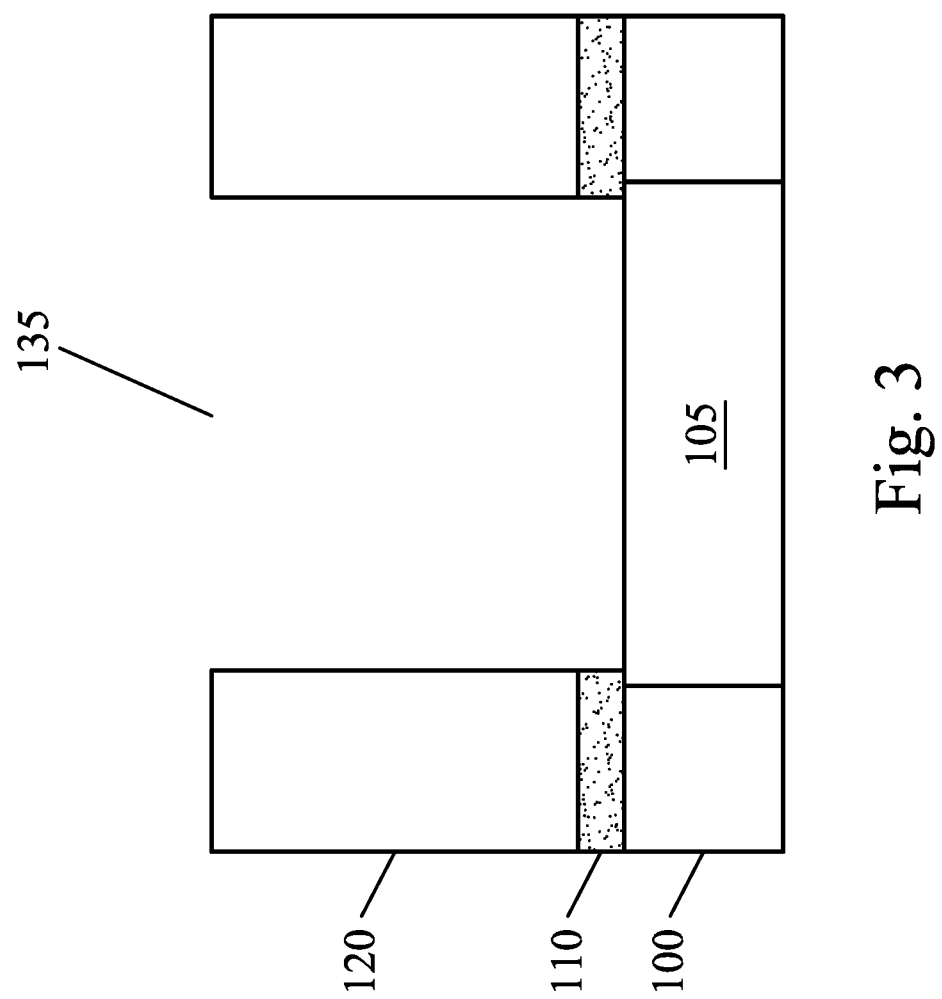

In FIG. 3, the mask layer 130 is removed. The mask layer 130 may be removed by any suitable technique, such as an etching technique, a chemical mechanical polishing (CMP) technique, or an ashing technique, depending on the material of the mask layer 130. In the same process or in a separate process, a pre-treatment may be performed on the opening 135. The pre-treatment may remove residues from the etching process and any oxides which may form on the conductive feature 105 and/or the sidewalls of the opening 135. In some embodiments, the pre-treatment may include a cleaning process rinsing the opening 135 with a deionized water, diluted hydrofluoric acid (DHF), $H_2SO_4$, $H_2O_2$, or the like, or combinations thereof.

Figure 4:
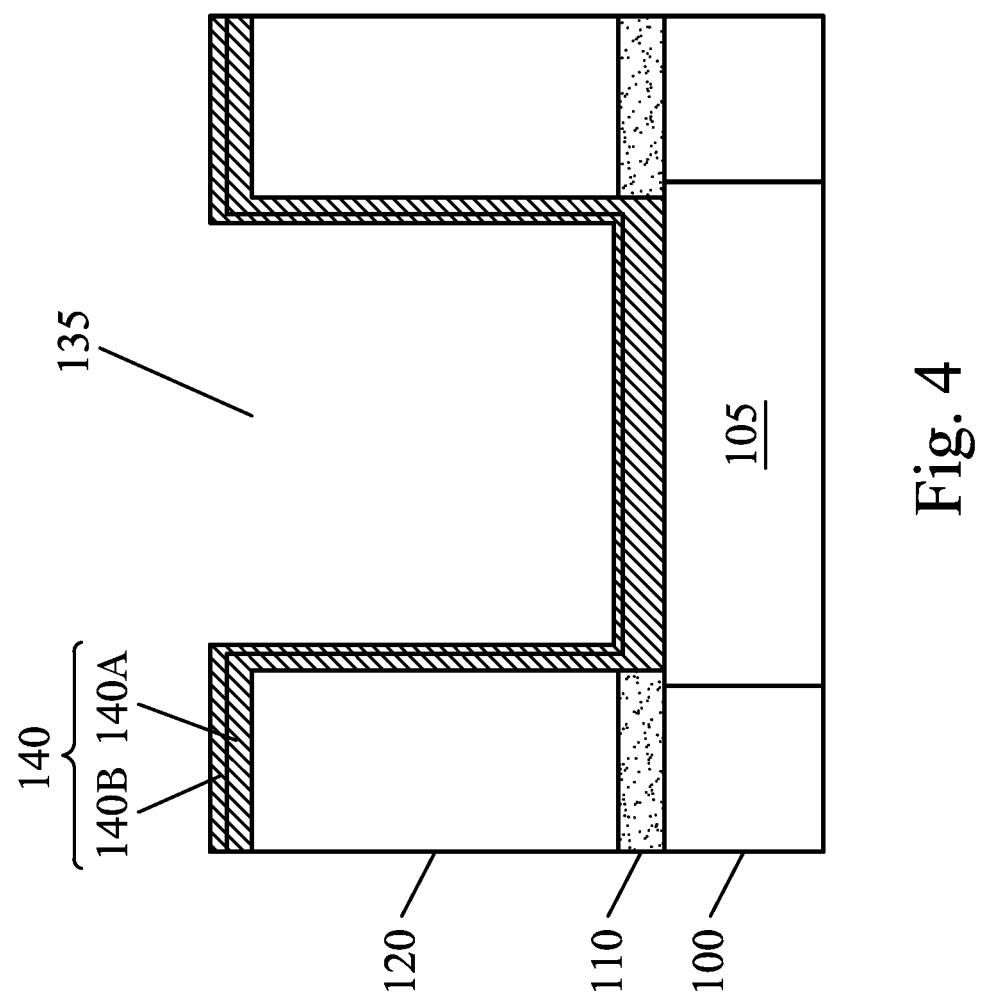

In FIG. 4, a barrier layer 140 is formed. The barrier layer may serve to enhance the adhesion of the subsequent conductive fill as well as provide a barrier to inhibit leeching of the conductive material into the surrounding material of the interconnect layer 120. In some embodiments, the barrier layer 140 may include one or more layers. For example, a first layer 140A may be deposited in the opening 135. The first layer 140A may include any suitable material, such as Ti or the like and may be deposited using any suitable deposition process, such as by CVD, PVD, sputtering, ALD, and/or the like. Following the deposition of the first layer 140A, the second layer 140B may be formed. In some embodiments, the second layer 140B may be formed by an in situ process which converts a portion of the first layer 140A into another material, such as by oxidation or direct nitridation. In other embodiments, the second layer 140B may be formed by depositing a separate layer over the first layer 140A. The second layer 140B may include any suitable material, such as TiN, or the like, and may be formed using any suitable process, such as by CVD, PVD, magnetron RF/DC co-sputtering (RFDC PVD), ALD, direct nitridation (e.g., of Ti), oxidation, and/or the like. Following the formation of the barrier layer 140, the thickness of the first layer 140A and the thickness of the second layer 140B may be between about 5 nm to about 100 nm and about 5 nm to about 100 nm, respectively, though any suitable thicknesses are contemplated.

Figure 5:
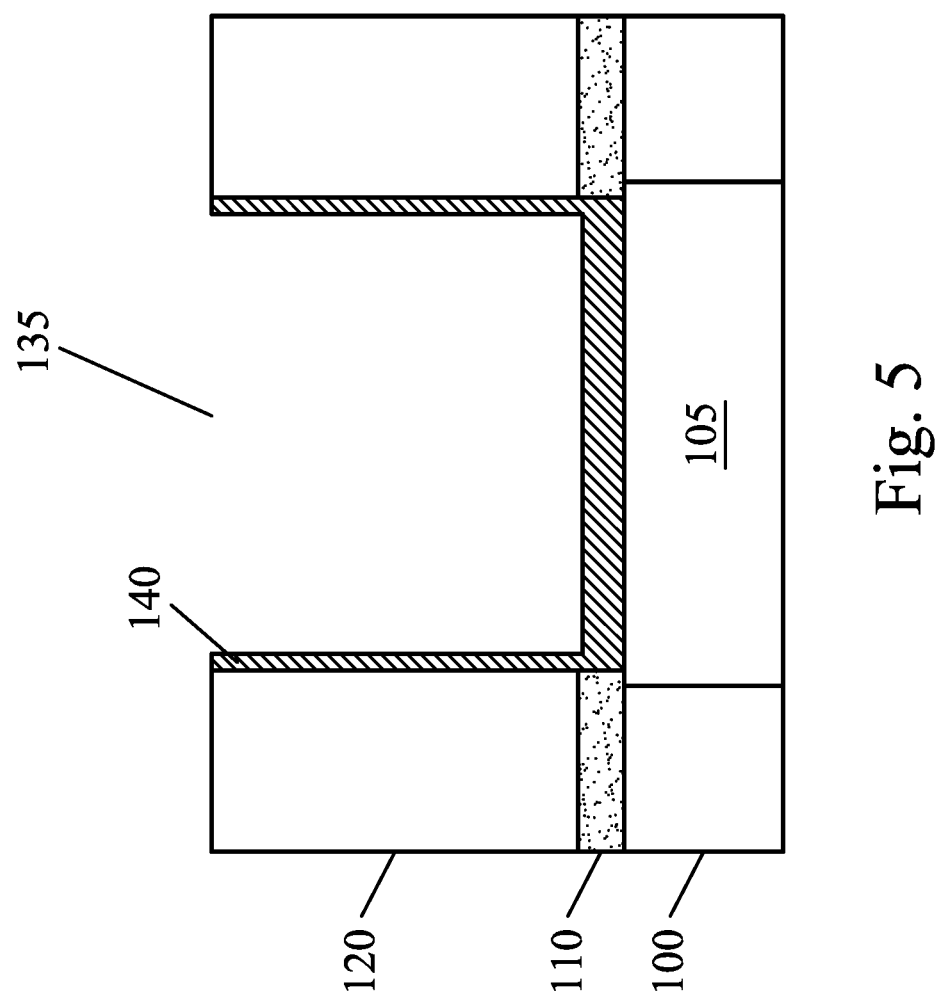

In FIG. 5, following the formation of the barrier layer 140, in some embodiments the upper surfaces may be planarized, such as by using a CMP process to remove the upper portions of the barrier layer 140 which extend beyond the opening 135. In such embodiments, the uppermost surface of the interconnect layer 120 and uppermost surfaces of the barrier layer 140 may be planarized to be level with each other. This planarization process may be performed at other places in the process flow, for example, after an adhesive layer and/or seed layer is also deposited, described below.

Figure 6:
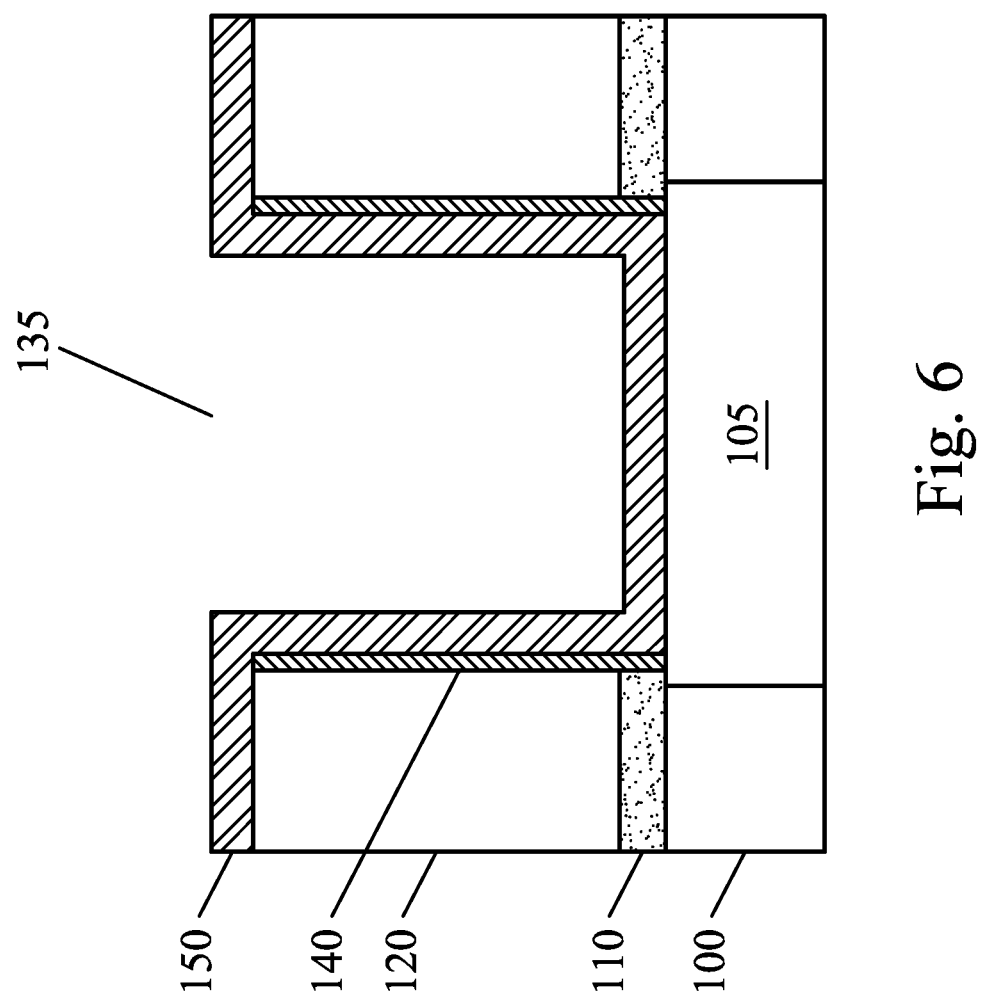

In FIG. 6, an adhesive layer 150 may optionally be deposited over the barrier layer 140. In some embodiments, the material of adhesive layer 150 may include the same material as the second layer 140B, while in other embodiments these materials may be different. Although the material of adhesive layer 150 may be the same as the material of the second layer 140B, an interface between these two distinct layers is detectable. In some embodiments, the adhesive layer 150 is used to thicken the barrier layer 140 and to provide better adhesion and barrier for the subsequently formed conductive fill. The adhesive layer 150 may also be referred to as a second barrier layer. The thickness of the adhesive layer 150 may be between about 5 nm to about 200 nm, though any suitable thicknesses are contemplated. The adhesive layer 150 may include any suitable material, such as TiN, or the like, and may be formed using any suitable process, such as by CVD, PVD, magnetron RF/DC co-sputtering (RFDC PVD), ALD, direct nitridation (e.g., of Ti), oxidation, and/or the like.

Figure 7:
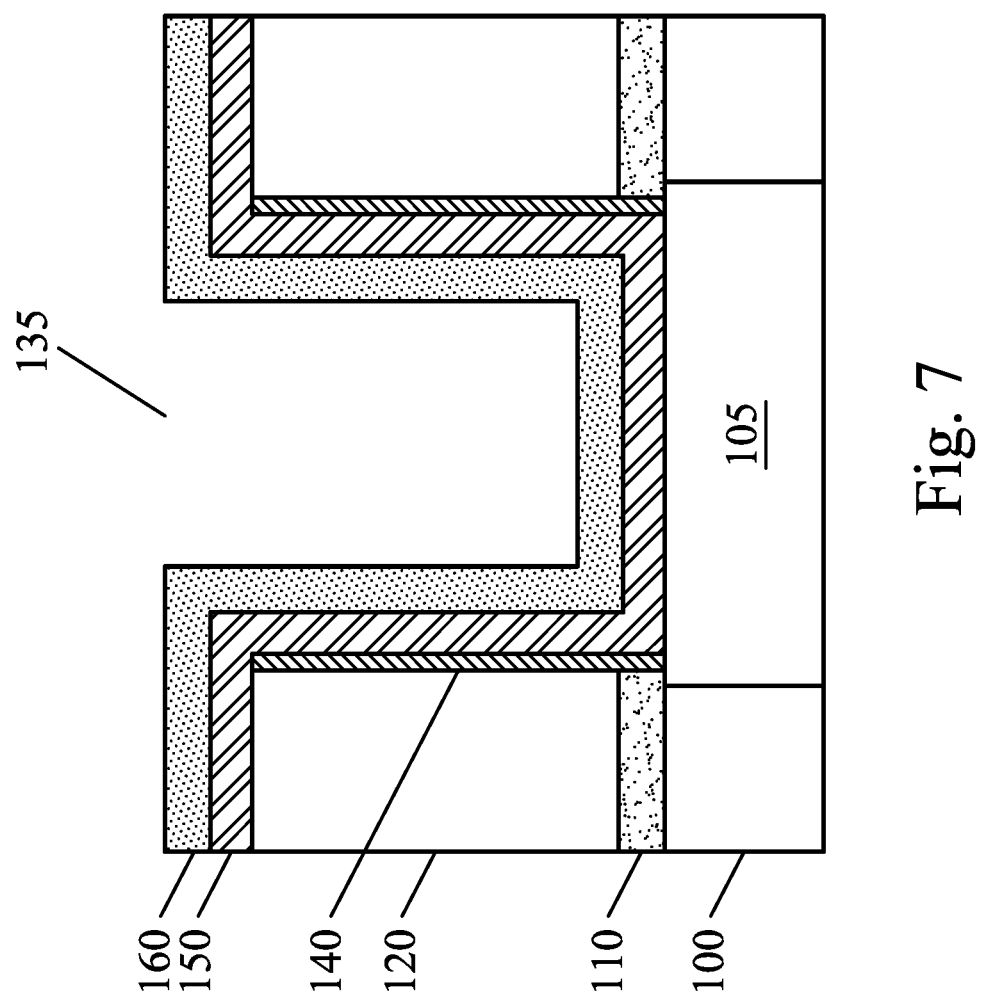

In FIG. 7, a seed layer 160 is deposited in the opening 135 over the adhesive layer 150 (or the barrier layer 140) and over the upper surface of the interconnect layer 120. The material of the seed layer 160 may be formed from the same material which will later fill the opening 135, or may be formed of another suitable material. In some embodiments in which the conductive material used to subsequently fill the opening 135 and form a conductive fill includes cobalt (Co), the seed layer 160 may include a Co seed layer. In some embodiments in which the conductive material used to subsequently fill the opening 135 and form a conductive fill includes copper (Cu), the seed layer 160 may include a Cu seed layer. In other embodiments, another suitable metal, such as titanium (Ti), Tungsten (W), titanium nitride, tantalum (Ta), tantalum nitride, ruthenium (Ru), or the like, may be used to form the seed layer 160. The seed layer 160 may have a thickness of, for example, 5 nm to 300 nm and may be formed using any suitable deposition technique such as, CVD, PVD, ALD and the like. In some embodiments, the seed layer 160 is a conformal layer. The seed layer 160 may be disposed as a continuous liner on the surface of the wafer, and along the sidewalls and at the bottom surface of the openings 135. The adhesive layer 150 and/or barrier layer 140 can help block diffusion of the material of the seed layer 160 into the interconnect layer 120.

Figure 8:
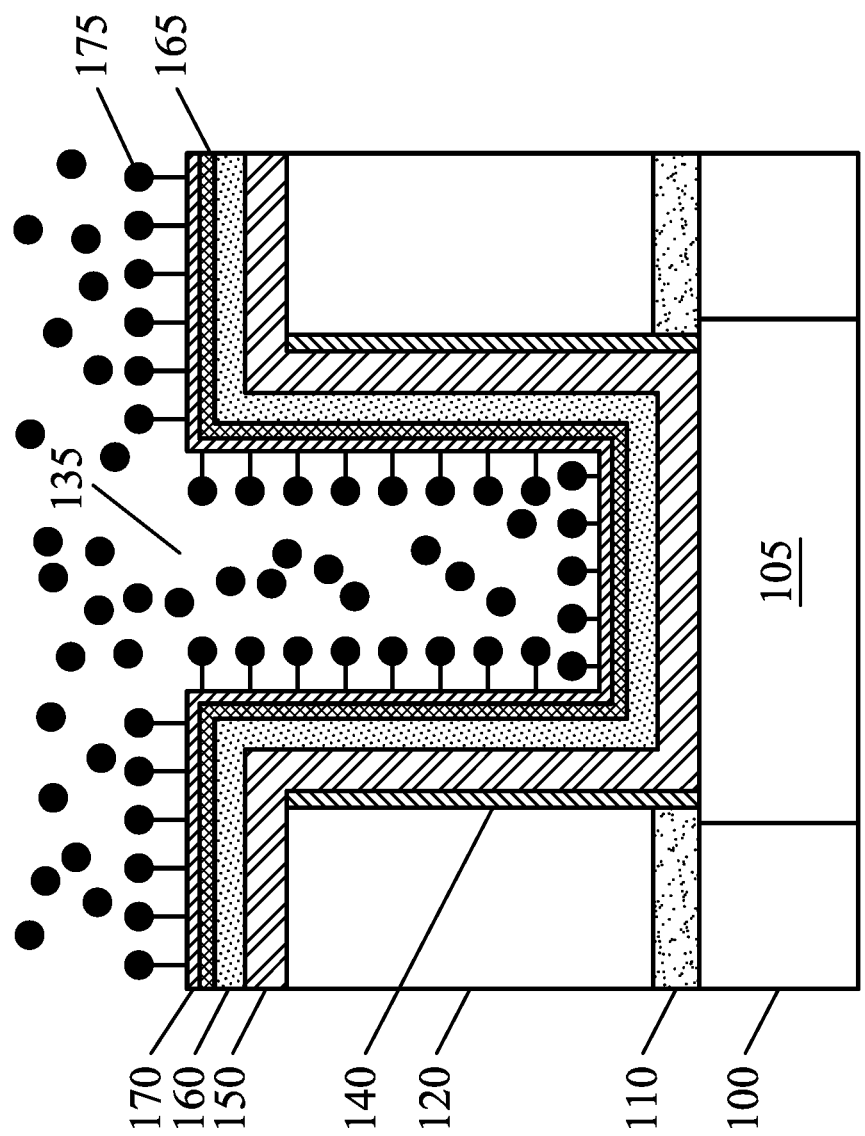
Figure 9:
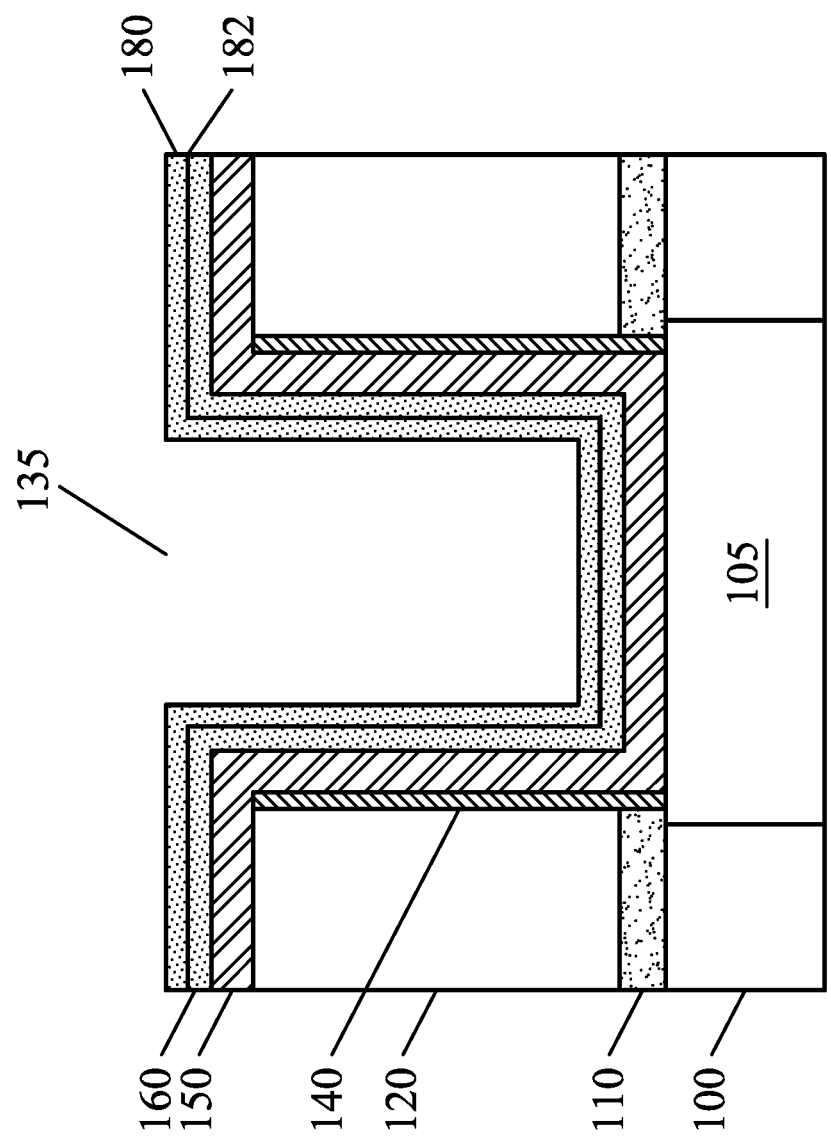

In FIG. 8, after formation of the seed layer 160, the seed layer 160 may be exposed to an ambient condition which contains oxygen, such as ambient air. For example, the seed layer 160 may be formed on a wafer which is moved from one processing apparatus to another, in which process the wafer and the seed layer 160 is exposed to ambient air. As a result, the seed layer 160 oxidizes. The oxygen reacts with the seed layer 160 to form a thin oxide layer 165. An example of such a reaction is described by the chemical equation:

$$M + \tfrac{1}{2}O_2 \rightarrow MO \qquad \text{(eq. 1)}$$

where M is the metal of the seed layer, such as cobalt (Co) or copper (Cu), and O is oxygen. In some embodiments the thin oxide layer 165 may include a few monolayers of a metal oxide, such as cobalt oxide (CoO) or copper oxide (CuO), having a thickness between about 1 nm to about 10 nm. If left in place, the presence of an oxide in the form of the thin oxide layer 165 would reduce the performance characteristics of the subsequently formed conductive fill. The oxide would cause bubble defects in the subsequently formed conductive fill where the material of the conductive fill could not adequately bond to the metal of the seed layer. The oxide would also increase resistivity of the subsequently formed conductive fill.

In addition, portions of the thin oxide layer 165 and/or seed layer 160 may undergo hydroxylation where hydroxyl groups adsorb onto the surface of the thin oxide layer 165 and/or seed layer 160 to form metal hydroxide or metal oxyhydroxide layer 170. Examples of such groups include $M(OH)_2$ and/or $MO(OH)$, where M is the metal of the seed layer, O is oxygen, and OH is a hydroxyl group. For example, where the metal is cobalt, hydroxyl groups may form on the surface of the thin oxide layer 165 and bond to the cobalt and/or the cobalt oxide. Thus, hydroxyl groups may include cobalt hydroxide and/or cobalt oxyhydroxide. Where the metal is copper, hydroxyl groups may form on the surface of the thin oxide layer 165 and bond to the copper and/or the copper oxide. Thus, hydroxyl groups may include copper hydroxide and/or copper oxyhydroxide In some embodiments some or all of the metal hydroxides may decompose to a metal oxide. An example of such a reaction is described by the chemical equation:

$$M(OH)_2 \rightarrow MO + H_2O \qquad \text{(eq. 2)}$$

where M is the metal of the seed layer, such as cobalt (Co) or copper (Cu), O is oxygen, and $H_2O$ is water in gaseous form.

Water molecules, illustrated as element 175 of FIG. 8, are attracted to the hydroxylated surface of the metal hydroxide or metal oxyhydroxide layer 170 where they adsorb on the surface of the layer where hydroxides are available. An example of such a reaction may be described by the chemical equation:

$$-OH + H_2O_{vapor} \rightarrow OH^*H_2O_{ads} \qquad \text{(eq. 3)}$$

where —OH represents a hydroxyl group, $H_2O_{vapor}$ represents vapor phase water, the symbol * represents a coordinate bonding to form a coordination complex, and $H_2O_{ads}$ represents a water ligand adsorbed onto the surface of the thin oxide layer 165 and/or seed layer 160.

As explained in further detail below, to improve contact performance and provide fewer defects, a treatment process will be used to remove some or all of the oxidation from the seed layer 160. In other words, the thin oxide layer 165 will be modified into a second seed layer by removing or substantially reducing the oxygen in the thin oxide layer 165. Following removing or substantially reducing the oxygen, the surface of the second seed layer will be re-hydroxylated using water vapor to form a hydroxyl layer of the second seed layer. This layer will improve wettability for the subsequent formation of a conductive fill. These surface treatment processes are in situ processes wherein once the thin oxide layer 165 is reduced or removed using a surface treatment of the seed layer 160, the treated surface is not exposed to an ambient containing oxygen (e.g., air) before a conductive fill is deposited over the seed layer 160. In other words, the cleaned surface may remain in vacuum or may be exposed to non-reactive ambient gasses during the process.

Still referring to FIG. 8, a treatment process is used to remove or substantially reduce the oxygen in the thin oxide layer 165. The treatment process may include a vacuum pre-treatment module (VPM) process, an Advanced (or Active) pre-Clean (APC) process, a Metal Clean xT (MCxT) process using a Metal Clean version xT tool, the like, or combinations thereof. In some embodiments, the treatment process may be performed in a cluster tool with multiple processing areas or chambers which the wafer or workpiece may be placed without breaking vacuum.

As to the VPM process, the VPM process treats the surface of the thin oxide layer 165 under vacuum to provide a radicalized (i.e., active) species, such as hydrogen radicals, to the surface, react the species with the oxygen in the thin oxide layer 165, and produce a byproduct. Where the species is hydrogen, the byproduct may be water in the form of steam. Even though the cluster tool may include several processing areas, for the purposes of the discussion below, the VPM process and subsequent deposition of the conductive fill are considered in situ since vacuum is maintained throughout.

An example use of the VPM process is described here, however, it should be appreciated that the details of this description are merely one example and other materials and process conditions may be used as appropriate. In this example, the seed layer 160 comprises Co and the thin oxide layer 165 comprises CoO, though other materials may be used and substituted as appropriate. The active species are reducing agents (e.g., hydrogen radicals H*) generated in a remote plasma chamber. The plasma may be generated using, for example, a carrier gas (e.g., Ar, $N_2$) at a flow rate of about 10 sccm to about 10,000 sccm, a process gas (e.g., $H_2$, $NH_3$, or the like) at a flow rate of about 3 sccm to about 15 sccm, at a pressure of about 50 mTorr to about 1000 mTorr, a temperature of about 25° C. to about 500° C., and a stabilization time of about 1 second to about 300 seconds. An RF power of about 1 kW to about 6 kW at an excitation frequency of about 13 MHz to about 40 MHz may be used to generate hydrogen radicals. The hydrogen radicals generated in the remote plasma discussed above are directed from the remote plasma chamber to the wafer where the hydrogen radicals react with CoO present on the surface. An example of such a reaction is described by the chemical equation:

$$CoO + 2H^* \rightarrow Co + H_2O(g) \qquad \text{(eq. 4)}$$

The reaction may take place at a pressure of about 10 mTorr to about 500 mTorr and a temperature of about 30° C. to about 500° C. for a time period of about 10 seconds to about 50 seconds to reduce the CoO to Co and produce a byproduct of $H_2O$ in the form of steam. The process conditions may be varied dependent upon the materials and the conditions.

For example, if the thin oxide layer 165 is thicker, then it may be desirable to perform the process for a longer period of time. Other chemicals and chemical reactions may also be used for substantial reduction/removal of the thin oxide layer 165.

When the material of the seed layer is copper (Cu), an example of the reaction of the VPM process is described by the chemical equation:

$$CuO + 2H^* \rightarrow Cu + H_2O(g) \qquad (eq. 5)$$

Process conditions may be similar to those provided above with respect to cobalt.

Turning back to the other treatment processes noted above, as to the APC process, the APC process may reduce or remove the thin oxide layer 165 by chemically reacting the thin oxide layer 165 with hydrogen radicals. The APC process may use a carrier gas (e.g., Ar, and/or $H_2O$) at a flow rate of about 10 sccm to about 10,000 sccm, a process gas (e.g., pure $H_2$, or 1% to 99% dilute $H_2$ in a mixture of $H_2$ and air) at a flow rate of about 10 sccm to about 3000 sccm, at a pressure of about $8 \times 10^{-6}$ mTorr to about 900 Torr, a temperature of about 25° C. to about 100° C., and an RF power of about 5 W to about 7 kW at an excitation frequency of about 13 MHz to about 40 MHz. The wafer may be exposed (e.g., to the H*) in the APC tool for a time of about 1 seconds to about 1000 seconds.

As to the MCxT process, the MCxT process may reduce or remove a portion of the thin oxide layer 165 by using sputter etching with energetic ions (e.g., Ar ions at energies of about 0.01 keV to about 10 keV). The MCxT process may use a process gas (e.g., Ar, $H_2$, $N_2$, or a $H_2/N_2$ mixture) at a flow rate of about 10 sccm to about 1000 sccm, at a pressure of about 1 mTorr to about 1000 mTorr, a temperature of about 25° C. to about 100° C., an RF power of about 10 W to about 500 W at an excitation frequency of about 13 MHz to about 40 MHz, and a DC bias of about 0.5 kV to about 40 kV. The wafer may be exposed to energetic ions (e.g., to the Ar ions) in the MCxT tool for a time of about 2 seconds to about 200 seconds In FIG. 9, as a result of the treatment process, the thin oxide layer 165 is converted into a second seed layer 180. An interface 182 between the seed layer 160 and the second seed layer 180 may include oxygen remnants in the form of metal oxide (e.g., CoO or CuO) and/or in the form of hydroxyl groups (—OH). The wafer may be transferred within the cluster tool to the chamber of the cluster tool where the conductive fill 190 (illustrated in FIG. 11) may be deposited over the second seed layer 180 during a subsequent processing step. The equipment used to perform the treatment process and the equipment used to deposit the conductive fill 190 may be integrated into the same cluster tool. As such, the treatment process may be performed in situ without exposing the treated (de-oxidized) surface to ambient containing oxygen (e.g., air) during the time the wafer is transferred to the equipment used for depositing the conductive fill 190 (e.g., a Co fill layer or a Cu fill layer; see FIG. 11).

In some embodiments, an in situ water vapor treatment process may be used to re-hydroxylate the second seed layer 180 to form a hydroxyl sublayer 185 including hydroxyl groups at the surface of the second seed layer 180. Hydroxylating the surface of the second seed layer provides several advantages. Wettability is significantly improved for the subsequently deposited conductive fill 190 (see FIG. 11). Due to the improved wettability, bubble defects are reduced which may occur between the conductive fill 190 and the second seed layer 180. Also, the surface of the wafer is moisturized with water vapor, providing improved conditions for electro-chemical plating depositing the conductive fill 190. In this process, the surface is transformed from being hydrophobic to being hydrophilic, providing a film contact angle (the angle which a droplet's sidewall contacts the surface) of less than 30 degrees. In other words, water droplets sitting on the surface tend to be flatter. Hydroxylating the second seed layer 180 provides hydroxyl groups at the surface, but does not re-introduce metal oxides of the second seed layer 180. An example of such a reaction hydroxylating the second seed layer 180 is described by the chemical equation:

$$M + H_2O + \tfrac{1}{2}O_2 \rightarrow M(OH)_2 \qquad (eq. 6)$$

where M is the metal of the seed layer, such as cobalt (Co) or copper (Cu), and O is oxygen.

Once the surface of the second seed layer 180 is hydroxylated into a hydroxyl sublayer 185, the water vapor treatment process may continue to provide water (labeled as element 175 of FIG. 10) to the wafer which will be attracted to the hydroxyl groups at in the hydroxyl sublayer 185 and form a structure with the hydroxyl sublayer 185. The water may therefore be adsorbed onto the surface of the hydroxyl sublayer 185. An example of such a reaction for the adsorption of water onto the hydroxyl sublayer 185 is described by the chemical equation:

$$-OH + H_2O_{vapor} \rightarrow -OH^*H_2O_{ads} \qquad (eq. 7)$$

where —OH represents a hydroxyl group, $H_2O_{vapor}$ represents vapor phase water, the symbol * represents a coordinate bonding to form a coordination complex, and $H_2O_{ads}$ represents a water ligand for the metal of the second seed layer 180 adsorbed onto the surface of the hydroxyl sublayer 185.

An example implementation of the water vapor process is described, however, it should be recognized that several modifications may be made while keeping within the spirit of the specific implementation. The process is described in terms of a cobalt conductive fill 190 (see FIG. 11), however, other suitable materials may be used for conductive fill 190, including, for example, copper. Also, although the process is described as a "water vapor process," any suitable vapor may be used so long as it creates the hydroxyl groups. In some embodiments, for example, an alcohol-based vapor (such as ethanol, methanol, propanol, butanol, and the like; including a glycol such as ethylene glycol, methylene glycol, propylene glycol, butylene glycol, and the like) or aldehyde-based vapor (such as formaldehyde, acetaldehyde, propionaldehyde, and so forth) may be used instead of or in addition to water. However, for simplicity, this process will be referred to as a water vapor process.

In some embodiments, the cluster tool may be modified to provide a pipe from a vapor source (e.g., for the water vapor, alcohol vapor, or aldehyde vapor) to the chamber of the cluster tool where the water vapor process is performed. The pipe will transport the vapor from the vapor source to the chamber. The vapor source may be any suitable vapor producing device. For example, the vapor source may be a bubbler where a carrier gas is bubbled through deionized water (or aldehyde or alcohol) which is maintained near the boiling point to produce vapor. The carrier gas will transport the vapor via the pipe to the chamber. Other vapor sources may include a vapor drop device which can directly heat the vapor source to produce a vapor, an atomizer, an ultrasonic vaporizer, and so forth. In some embodiments, the vapor source may include more than one ampoule, where each ampoule holds the same or different source materials to be vaporized. For example, a vapor source may include an ampoule holding deionized water, another ampoule holding an alcohol, and another ampoule holding an aldehyde. The water vapor process may utilize vapors produced from any of the ampoules, singularly or in combination.

During the water vapor process, the temperature of the vapor source material in the ampoules may be maintained between about 10° C. and about 80° C., where the vapor source material is water. Where the vapor source material is an alcohol or aldehyde, the temperature may be maintained such that it is between about 10° C. over freezing point and about 20° C. below boiling point of the vapor source material. The water vapor process may be applied for a time between about 1 second and about 1000 seconds, though any suitable time is contemplated. Depending on the vapor source type gas-line temperature to the vapor source may be any value greater than 10° C. and about 200° C., though other temperatures are contemplated and may be used. The vapor pressure produced by the vapor source may be controlled to be between 0 and 100 torr. In some embodiments, the vapor provided by the vapor source may be piped directly to the chamber. In other embodiments, the vapor provided by the vapor source to the chamber in the water vapor process may be independently controlled to be between 0 and 100 torr. In such embodiments, the vapor provided by the vapor source may be controlled through a mixing valve to maintain pressure by mixing the supplied vapor with other gasses, such as other vapors from other ampoules (e.g., water vapor, alcohol vapor, or aldehyde vapor, etc.) to increase pressure in the chamber, venting vapor from the supplied vapor to reduce pressure in the chamber, or passing the vapor directly from the vapor source to the chamber. The temperature of the vapor source may be between 10° C. and about 200° C., though other temperatures may be used.

Figure 10:
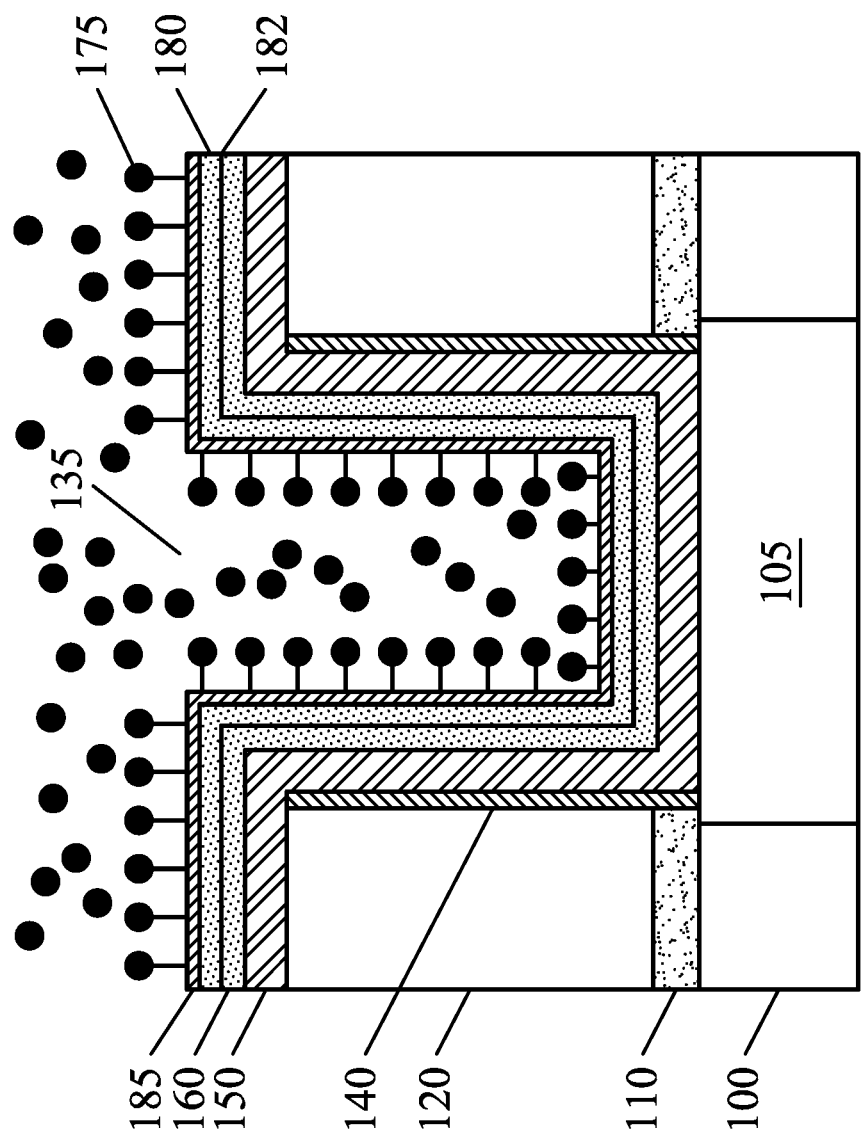
Figure 11:
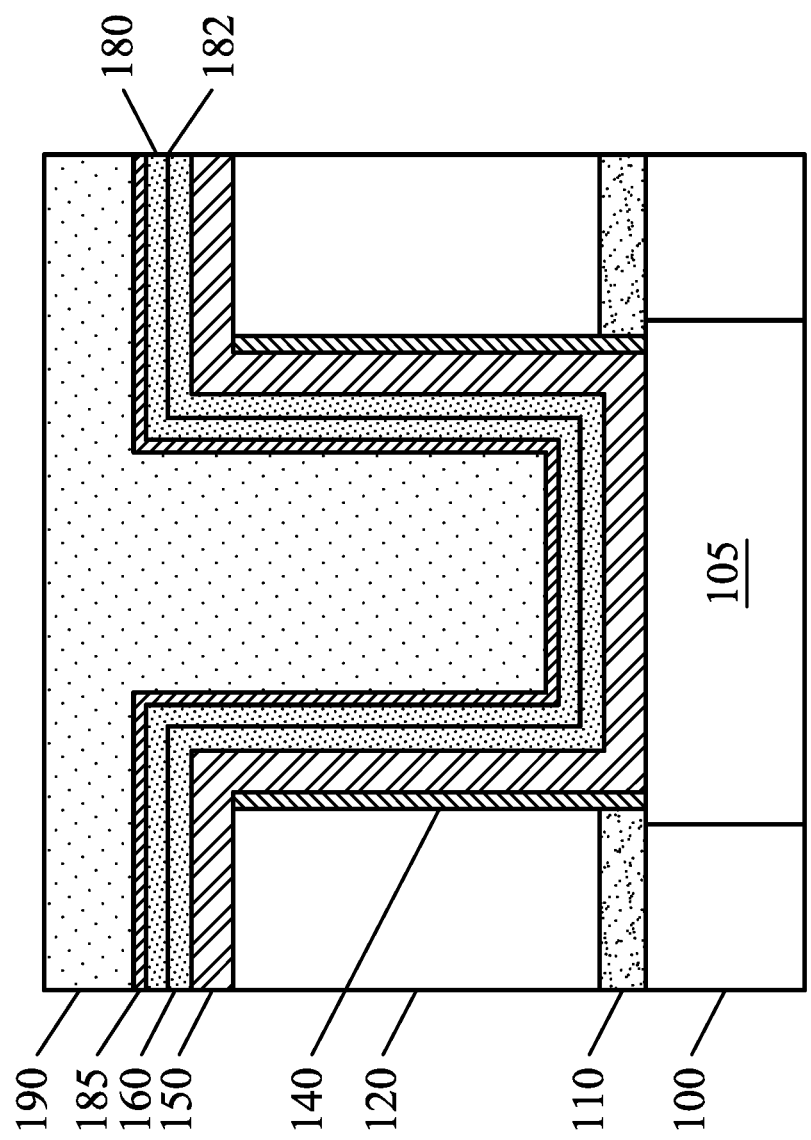
Figure 12:
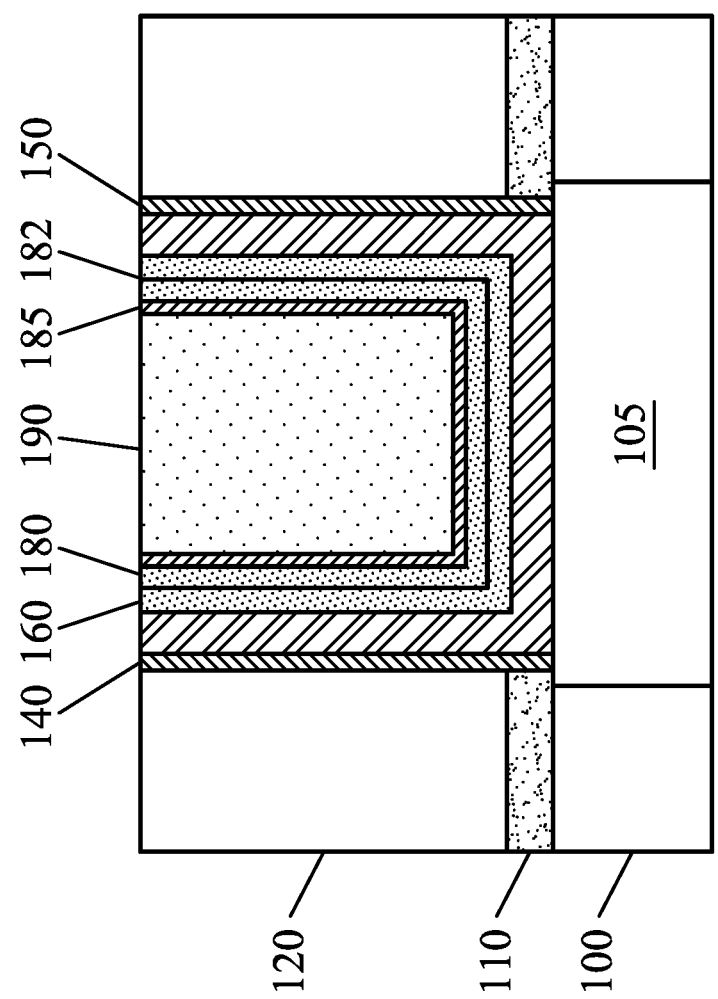

In FIG. 11, a conductive fill 190 is deposited in the opening 135 (see FIG. 10). The conductive fill 190 may be deposited to a thickness from about 4 nm to about 4000 nm, and may have a width between about 5 nm and about 100 nm, though other dimensions may be used and are contemplated. The conductive fill 190 may be deposited using, for example, an electrochemical plating (ECP) process, a DC PVD process, a RFDC PVD process, or the like. The deposition of conductive fill 190 may be performed where the opening 135 has a height to width ratio between about 1 and 20, such as about 5, although other ratios are contemplated and may be used.

In some embodiments, an ECP process may be used to deposit the conductive fill 190 in the opening 135 (see FIG. 10). ECP is an electrochemical process whereby a metal coating is deposited on a metallic surface by electrolysis. ECP involves immersing a pair of metallic electrodes in an electrolyte bath containing a conductive solution which collectively constitute an electrolysis cell. The surface on which the metal is to be deposited (e.g., the second seed layer 180) is generally biased as the cathode and the source of the material to be deposited (e.g., the working electrode) is generally the anode. Passing electrical current through the electrolysis cell causes the metal atoms to lose electrons (oxidation process) at the anode to form metal cations that dissolve into the solution while, at the same time, metal cations present in the electrolyte gain electrons (reduction process) at the cathode to get deposited on the cathode as metal atoms. In this manner material is corroded from the anode and deposited on the cathode. In some ECP processes the deposited metal may not come from the anode. Instead, the metallic ions may be added to the electrolyte from a separate source. The total deposition rate is proportional to the electroplating current flowing through the electrolysis cell (Faraday's law of electrolysis). Organic chemical additives, referred to as suppressors, levelers, and accelerators, may be used to control the deposition rate according to the topography of the surface being plated. For example, the deposition rate on sidewalls may be suppressed to achieve a predominantly bottom-fill ECP process.

In some embodiments, the ECP process may be performed in an electrolysis cell in a vacuum chamber where the pressure is from about 1 mTorr to about 1000 mTorr. The ECP process may be performed with a pump flow rate of about 3 liter/min to about 15 liter/min, a plating speed from about 5 rpm to about 500 rpm, a plating gap of about 0.1 mm to about 10 mm, and an electroplating current of about 0.1 ampere to about 90 ampere may be used for an electroplating time from about 0.1 second to about 1,000 seconds. In some embodiments, the substrate may be immersed in the electrolyte bath at a temperature of about 15° C. to about 30° C. during the ECP process.

Where cobalt is used as the material for the conductive fill 190, the electrolyte solution may comprise about 99% cobalt sulfate ($CoSO_4.7H_2O$) and about 1% dilute sulfuric acid, as well as small quantities of chemical additives that include, for example, a Co suppressor, such as an amine group, or polyethyleneimine, or the like. Other solutions may be used as appropriate. Where copper is used as the material for conductive fill 190, the electrolyte solution may comprise about 99% copper sulfate ($CuSO_4.5H_2O$) and about 1% dilute sulfuric acid, as well as small quantities of chemical additives that include, for example, a Cu suppressor. Other solutions may be used as appropriate.

During the ECP process, the removal of the oxide by the treatment process and the hydroxylation and wetting provided by the water vapor process provides better deposition of the of the metal of the electrolyte solution on the hydroxyl sublayer 185. As a result, bonding rates to the second seed layer 180 is increased and the frequency and size of voids and/or bubble defects are decreased. For example, in one demonstration, without the treatment process and water vapor process, where cobalt was used as the metal, CoO corrosion was measured to be 16.8 Å, while after the treatment process and water vapor process, the CoO corrosion was measured to be 11.2 Å, providing better access to the uncorroded second seed layer 180 and decreased resistivity in the subsequently formed conductive fill 190. With the additional benefit of better wetting provided by the hydroxyl sublayer 185, decreasing bubble defects provides further decreases in resistivity and also provides a conductive fill 190 which is better adhered and bonded in the opening 135 (see FIG. 9). In another demonstration, a test area about 25 mm by 33 mm was scanned for void defects or loss defects sized between about 50 nm and about 200 nm. In this demonstration, the average number of defects were determined to be about 1927 defects per sample where a cobalt conductive fill was used without the treatment process and without the water vapor process described above. When using the treatment process and the water vapor process described above, however, the defect count per sample was reduced to 10 defects per sample, representing a defect count reduction of over 19,000%. In some embodiments, defect average may be reduced to between about 5 and 50 defects per sample, representing a defect count reduction between about 5,000% and about 20,000%

In some embodiments, the hydroxyl sublayer 185 may be fully or partially consumed or transformed in the deposition of the conductive fill 190. In such embodiments, materials from hydroxyl groups may be present between the seed layer 180 and the conductive fill 190.

After deposition of the conductive fill 190, an edge bevel clean process may be performed using chemical sprays (e.g., $H_2O_2$, $H_2SO_4$ etc.) over a cleaning range of about 0.1 mm to about 3.0 mm from the edge of the wafer. In some embodiments, a post-deposition anneal may be done at a temperature from about 25° C. to about 400° C.

Next, as illustrated in FIG. 11, a suitable planarization technique such as chemical mechanical polish (CMP) may be used to remove excess materials from the upper surfaces of the interconnect layer 120, thereby exposing a top surface of the interconnect layer 120.

The above patterning and deposition process may be repeated as many times as necessary to build up an interconnect to a desired number of interconnect layers. For example, another optional etch stop layer such as the ESL 110 discussed above may be deposited over the interconnect layer 120 and the conductive fill 190. And another interconnect layer, such as the interconnect layer 120, may be deposited over the new optional etch stop layer (or directly over the interconnect layer 120 and conductive fill 190). Other layers (masks, mandrels, spacers, etc.) may also be deposited over these, as discussed above. Then the new interconnect layer can be patterned and one or more openings formed therein which is then filled with a conductive fill according to the processes discussed above.

After these processes are complete, subsequent processes may be used, such as packaging processes, including for example bump formation, encapsulation, bonding, and so on.

Figure 13:
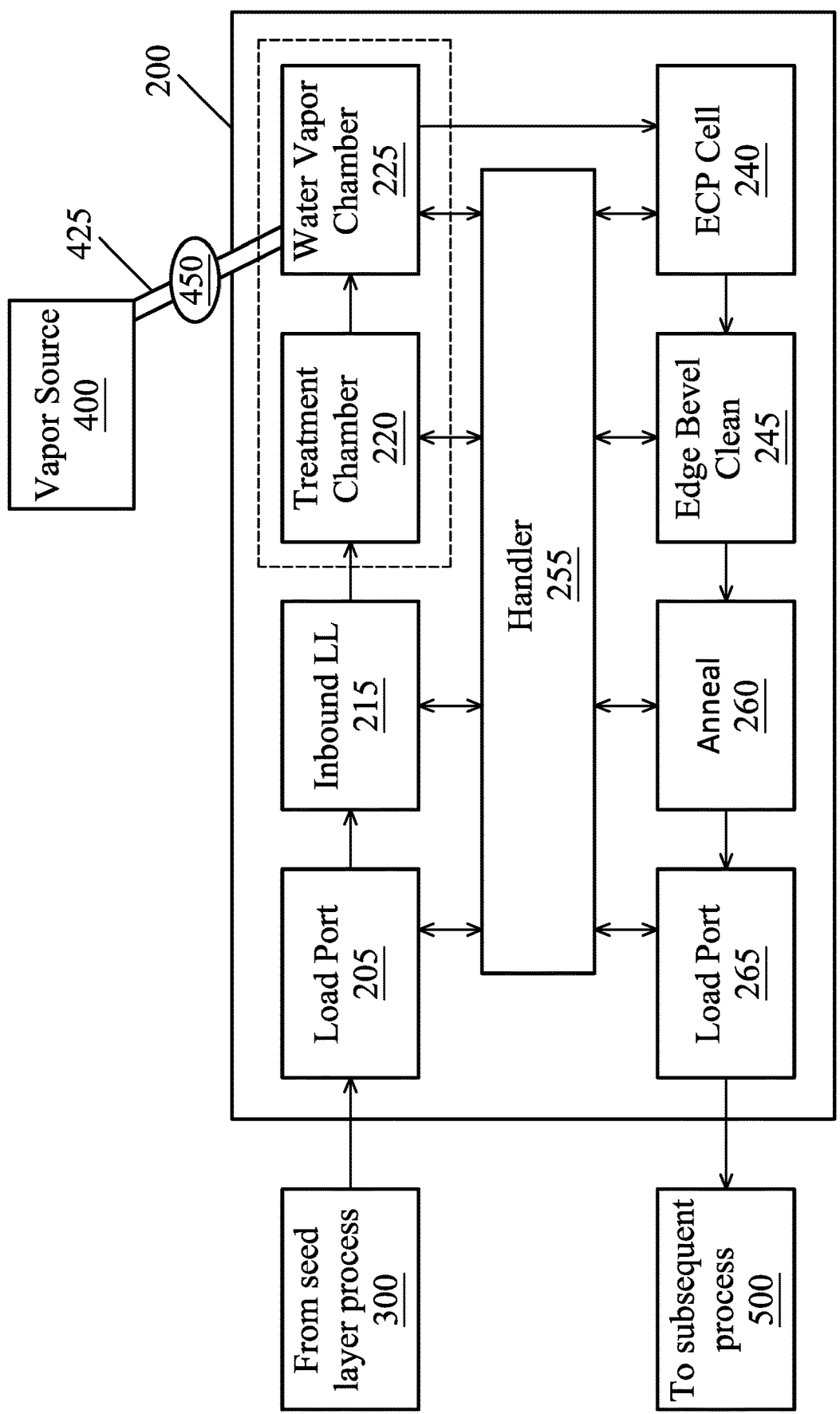
FIG. 13 illustrates a processing apparatus for forming a conductive fill, in accordance with some embodiments.

FIG. 13 illustrates a processing apparatus for forming a conductive fill, in accordance with some embodiments. Cluster tool 200 provides the treatment process, water vapor process, and ECP process in a single cluster tool. The cluster tool may be divided into different areas so that vacuum may be maintained throughout the treatment process and water vapor process. Other processes may also be located in the same cluster tool or may be located in other tools. After the seed layer has been formed in an opening, such as discussed above, a wafer is loaded into the cluster tool 200 by the load port 205. The handler 255 moves the wafer through the various processes and process chambers in the cluster tool 200. The handler 255 may include several different robotic arms located in different areas of the cluster tool 200. The handler 255 moves the wafer from the load port 205 to the inbound load lock 215, where the wafer is prepared for the treatment process. The wafer is then moved by the handler 255 to a treatment chamber 220 for the treatment process, such as the treatment process as discussed above with respect to FIG. 8. From there, the wafer is kept under vacuum (illustrated by the dashed box), where it is moved to a water vapor chamber 225 for the water vapor process, such as discussed above with respect to FIG. 9. During the water vapor process, a vapor is received from a vapor source 400 through a pipe 425 and optional mixing valve 450, each of which is discussed above.

The wafer is then moved to an electrochemical plating (ECP) cell 240 for deposition of the conductive fill, such as discussed above. In some embodiments, the vacuum may also be maintained during this transfer, while in other embodiments, the vacuum may be removed. Deposition of a conductive fill, such as conductive fill 190, is performed in the ECP cell 240. In some embodiments, the deposition may be by a different deposition technique using a different deposition tool. Following the deposition of the conductive fill, the handler 255 may move the wafer to an edge bevel clean 245 module where the wafer can be cleaned. Following the cleaning, the handler 255 can move the wafer to an anneal chamber 260 where the wafer and conductive fill is annealed. Next, the handler 255 can move the wafer to load port 265 (which may be the same or different load port than the load port 205). From there the wafer may be subject to a subsequent process 500, such as discussed above, such as performing a CMP process, forming another layer of an interconnect, or packaging processes, such as bump formation, encapsulation, and so forth.

Embodiments advantageously provide a conductive fill having reduced defects and reduced resistivity by eliminating or reducing oxidation of a seed layer prior to forming the conductive fill by a treatment process. A vapor process, such as a water vapor process, may then be used to hydrolyze and moisturize the seed layer to improve wettability, transforming the seed layer surface from hydrophobic to hydrophilic for a subsequent electrochemical plating process. The seed layer can be kept under vacuum after eliminating or reducing oxidation in order to avoid re-oxidation of the seed layer prior to the hydroxylation of the seed layer in the vapor process.

One embodiment is a method including forming an opening in an insulating layer. A barrier layer is formed in the opening. A seed layer is formed over the barrier layer, where the seed layer including a first material. The seed layer is treated to remove an oxide of the first material. The seed layer is hydrolyzed. A conductive fill is deposited over the hydrolyzed seed layer, the conductive fill including the first material.

Another embodiment is a method including patterning an insulating layer to form an opening therein. A first seed layer is deposited in the opening. Oxygen is introduced to the first seed layer to form a first oxide layer from a portion of the first seed layer. The first oxide layer is transformed into a second seed layer by a vacuum treatment process. The second seed layer is treated with a vapor process to hydrate a surface of the second seed layer. A conductive fill is deposited over the second seed layer.

Another embodiment is a device including an insulating layer over a substrate and a conductive fill embedded in the insulating layer, the conductive fill electrically coupled to a conductive feature of the substrate, the conductive fill including a first metal. The device also includes a first seed layer interposed between the conductive fill and the insulating layer, the first seed layer including the first metal. The device further includes a hydroxylated sub-layer of the first seed layer interposed between the first seed layer and the conductive fill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an opening in an insulating layer;
   forming a barrier layer in the opening;

forming a seed layer over the barrier layer, the seed layer comprising a first material;

treating the seed layer to remove an oxide of the first material;

hydrolyzing the seed layer; and depositing a conductive fill over the hydrolyzed seed layer, the conductive fill comprising the first material.

2. The method of claim 1, wherein hydrolyzing the seed layer comprises:

providing a vapor of a second material to the seed layer, the second material comprising water, an alcohol, an aldehyde, or a combination of two or more thereof.

3. The method of claim 2, further comprising:

modifying a cluster tool to provide a pipe from a vapor source to a chamber of the cluster tool, the chamber housing the seed layer while hydrolyzing the seed layer.

4. The method of claim 2, further comprising:

piping the vapor from a vapor source to a mixing valve; and piping the vapor from the mixing valve to the seed layer.

5. The method of claim 1, wherein the first material comprises cobalt or copper.

6. The method of claim 1, wherein treating the seed layer comprises:

putting the seed layer under vacuum;

generating hydrogen radicals; and reacting the hydrogen radicals with oxygen from the oxide of the first material to produce water byproduct.

7. The method of claim 6, wherein the seed layer remains under vacuum while the seed layer is moved from a first chamber where the treating of the seed layer is performed to a second chamber where the hydrolyzing of the seed layer is performed.

8. A method comprising:

patterning an insulating layer to form an opening therein;

depositing a first seed layer in the opening;

introducing oxygen to the first seed layer to form a first oxide layer from a portion of the first seed layer;

transforming the first oxide layer into a second seed layer by a vacuum treatment process;

treating the second seed layer with a vapor process to hydrate a surface of the second seed layer; and depositing a conductive fill over the second seed layer.

9. The method of claim 8, wherein the vapor process comprises:

piping a first vapor from a vapor source to the second seed layer; and reacting the first vapor with the second seed layer to form a hydroxylated sublayer of the second seed layer.

10. The method of claim 9, wherein depositing the conductive fill comprises:

performing an electrochemical plating process to bond deposit cobalt or copper to the hydroxylated sublayer.

11. The method of claim 9, wherein the first vapor comprises a vapor of water, an alcohol, an aldehyde, or a combination of two or more thereof.

12. The method of claim 9, further comprising:

forming a coordinated complex comprising the hydroxylated sublayer of the second seed layer and a ligand of a water molecule.

13. The method of claim 8, wherein the vacuum treatment process comprises:

placing the first oxide layer under vacuum; and reacting hydrogen radicals with the oxygen of the first oxide layer to reduce the oxygen in the first oxide layer and form water vapor byproduct.

14. The method of claim 13, further comprising:

maintaining vacuum while transferring the second seed layer from a first chamber of a cluster tool where the vacuum treatment process is performed to a second chamber of the cluster tool where the vapor process is performed.

15. The method of claim 8, further comprising:

prior to depositing the first seed layer, depositing a barrier layer in the opening, the barrier layer extending over an upper surface of the insulating layer;

removing the barrier layer extending over the upper surface of the insulating layer; and depositing a second barrier layer in the opening.

16. A device comprising:

an insulating layer over a substrate;

a conductive fill embedded in the insulating layer, the conductive fill electrically coupled to a conductive feature of the substrate, the conductive fill comprising a first metal;

a first seed layer interposed between the conductive fill and the insulating layer, the first seed layer comprising the first metal; and a sub-layer of the first seed layer interposed between the first seed layer and the conductive fill, the sub-layer comprising hydroxyl group materials.

17. The device of claim 16, further comprising:

a second seed layer interposed between the first seed layer and the insulating layer.

18. The device of claim 17, further comprising:

an oxide of the first seed layer at an interface of the first seed layer and the second seed layer.

19. The device of claim 16, further comprising:

a barrier layer interposed between the first seed layer and the insulating layer.

20. The device of claim 16, wherein the first metal comprises copper or cobalt and wherein the conductive fill has an aspect ratio between 1 and 20.

* * * * *